United States Patent
Yoshida et al.

(10) Patent No.: US 11,948,620 B2
(45) Date of Patent: Apr. 2, 2024

(54) SEMICONDUCTOR DEVICE HAVING POWER CONTROL CIRCUIT

(71) Applicant: MICRON TECHNOLOGY, INC., Boise, ID (US)

(72) Inventors: Kazuhiro Yoshida, Saitama (JP); Go Takashima, Sagamihara (JP); Haruka Momota, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 159 days.

(21) Appl. No.: 17/740,200

(22) Filed: May 9, 2022

(65) Prior Publication Data
US 2023/0360688 A1    Nov. 9, 2023

(51) Int. Cl.
G11C 11/10 (2006.01)
G11C 11/4074 (2006.01)
H10B 12/00 (2023.01)

(52) U.S. Cl.
CPC .......... *G11C 11/4074* (2013.01); *H10B 12/50* (2023.02)

(58) Field of Classification Search
CPC .. G11C 11/4074; H10B 12/50; H01L 27/0207
See application file for complete search history.

(56) References Cited

U.S. PATENT DOCUMENTS

2008/0159018 A1* 7/2008 Matano ............... G11C 11/4074
                                                365/230.03
2022/0199126 A1* 6/2022 Lee ..................... G11C 11/4093

* cited by examiner

*Primary Examiner* — Xiaochun L Chen
(74) *Attorney, Agent, or Firm* — Dorsey & Whitney LLP

(57) ABSTRACT

Disclosed herein is an apparatus that includes: a semiconductor substrate including first and second source regions coupled to a first power supply line and first and second drain regions coupled to a second power supply line, the first drain region being arranged between the first and second source regions, the second source region being arranged between the first and second drain regions; and gate electrodes including a first gate electrode arranged between the first source region and the first drain region, a second gate electrode arranged between the first drain region and the second source region, and a third gate electrode arranged between the second source region and the second drain region. The first and third gate electrodes are supplied with a first control signal. The second gate electrode is supplied with a second control signal.

20 Claims, 8 Drawing Sheets

SEMICONDUCTOR DEVICE HAVING POWER CONTROL CIRCUIT

BACKGROUND

There is a case where current supply capacity of a power supply circuit is designed to be variable according to a required performance in semiconductor devices such as a DRAM (Dynamic Random Access Memory).

DETAILED DESCRIPTION

Various embodiments of the present disclosure will be explained below in detail with reference to the accompanying drawings. The following detailed description refers to the accompanying drawings that show, by way of illustration, specific aspects, and various embodiments of the present disclosure. The detailed description provides sufficient detail to enable those skilled in the art to practice these embodiments of the present disclosure. Other embodiments may be utilized, and structural, logical, and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
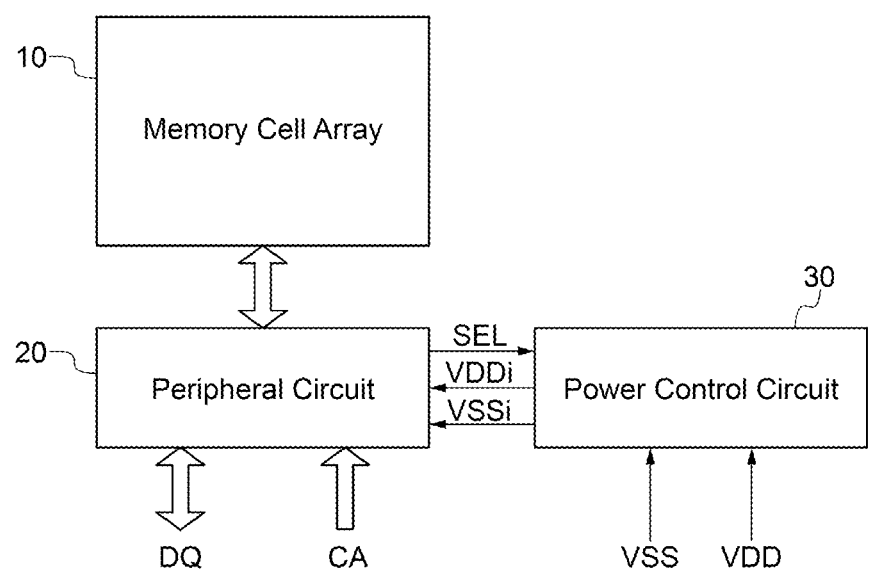
FIG. 1 is a block diagram showing a configuration of a semiconductor device according to one embodiment of the present disclosure.

FIG. 1 is a block diagram showing a configuration of a semiconductor device according to one embodiment of the present disclosure. The semiconductor device shown in FIG. 1 is, for example, a DRAM and includes a memory cell array 10, a peripheral circuit 20, and a power control circuit 30. The peripheral circuit 20 performs an access operation to the memory cell array 10 on the basis of a command address signal CA supplied externally. For example, when the command address signal CA indicates a read operation, read data DQ read from the memory cell array 10 is output to outside. When the command address signal CA indicates a write operation, write data DQ input from outside is written to the memory cell array 10. The power control circuit 30 supplies an internal power potential VDDi and an internal ground potential VSSi to the peripheral circuit 20. The internal power potential VDDi is derived from an external power potential VDD supplied externally. The internal ground potential VSSi is derived from an external ground potential VSS supplied externally. The level of the internal power potential VDDi can be same as that of the external power potential VDD or can be different therefrom. The level of the internal ground potential VSSi can be same as that of the external ground potential VSS or can be different therefrom. The current supply capacity of the power control circuit 30 can be adjusted by a selection signal SEL supplied from the peripheral circuit 20.

Figure 2A:
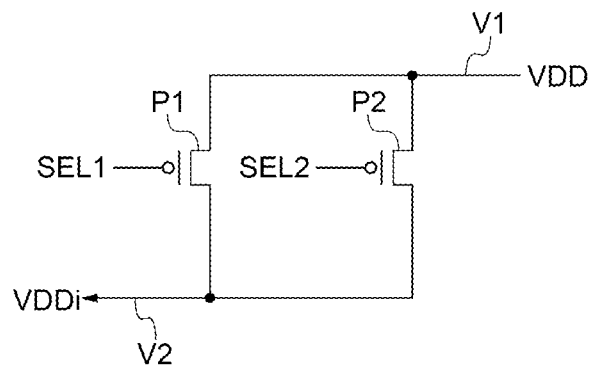
FIG. 2A is a circuit diagram showing an example of one main part of a power control circuit.

As shown in FIG. 2A, the power control circuit 30 can include two P-channel MOS transistors P1 and P2 coupled in parallel. The external power potential VDD is supplied to sources of the transistors P1 and P2 in common via a power supply line V1. The transistors P1 and P2 are turned on by selection signals SEL1 and SEL2, respectively, and the internal power potential VDDi is output from drains thereof via a power supply line V2. When a high performance is required, the selection signals SEL1 and SEL2 are both activated (e.g., high current operation mode). This causes both the transistors P1 and P2 to be turned on, so that a high current supply capacity can be obtained. On the other hand, when current consumption is to be reduced, one of the selection signals SEL1 and SEL2 is activated (e.g., reduced current operation mode). This causes only one of the transistors P1 and P2 to be turned on, so that the current supply capacity is restricted and the current consumption is reduced. The current supply capacities of the transistors P1 and P2 can be same as each other or can be different from each other. When the current supply capacities of the transistors P1 and P2 are different from each other as an example, the current supply capacity for the internal power potential VDDi can be adjusted in three levels.

Figure 2B:
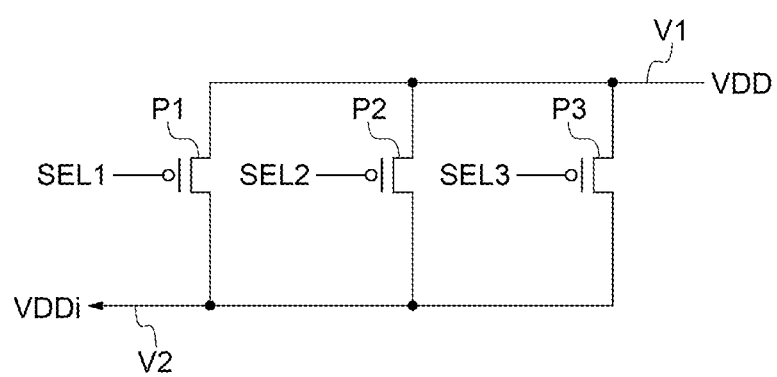
FIG. 2B is a circuit diagram showing another example of one main part of the power control circuit.

As shown in FIG. 2B, the power control circuit 30 may include three P-channel MOS transistors P1, P2, and P3 coupled in parallel. The external power potential VDD is supplied in common to sources of the transistors P1, P2, and P3 via the power supply line V1. The transistors P1, P2, and P3 are turned on by selection signals SEL1, SEL2, and SEL3, respectively, and the internal power potential VDDi is output from drains thereof via the power supply line V2. When a high performance is required, the selection signals SEL1, SEL2, and SEL3 are all activated (e.g., high current operation mode). This causes all the transistors P1, P2, and P3 to be turned on, so that a high current supply capacity can be obtained. On the other hand, when the current consumption is to be reduced, one or two of the selection signals SEL1, SEL2, and SEL3 is inactivated (e.g., multiple reduced current operation modes). This causes one or two of the transistors P1, P2, and P3 to be turned off, so that the current supply capacity is restricted and the current consumption is reduced. The current supply capacities of the transistors P1, P2, and P3 can be same as each other or can be different from each other. When the current supply capacities of the transistors P1, P2, and P3 are different from each other as an example, the current supply capacity for the internal power potential VDDi can be adjusted in seven levels.

Figure 2C:
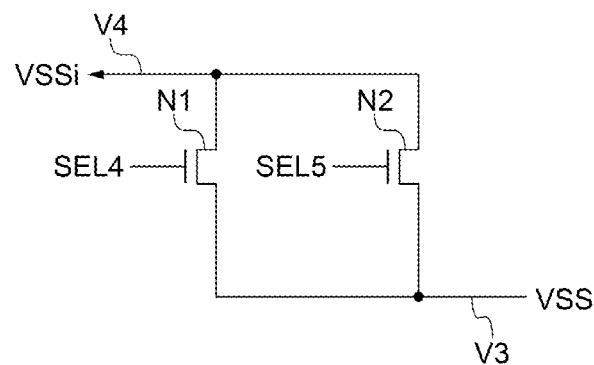
FIG. 2C is a circuit diagram showing an example of another main part of the power control circuit.

As shown in FIG. 2C, the power control circuit 30 may include two N-channel MOS transistors N1 and N2 coupled in parallel. The external ground potential VSS is supplied in common to sources of the transistors N1 and N2 via a power supply line V3. The transistors N1 and N2 are turned on by selection signals SEL4 and SEL5, respectively, and the internal ground potential VSSi is output from drains thereof via a power supply line V4. When a high performance is required, the selection signals SEL4 and SEL5 are both activated (e.g., high current operation mode). This causes both the transistors N1 and N2 to be turned on, so that a high current supply capacity can be obtained. On the other hand, when the current consumption is to be reduced, one of the selection signals SEL4 and SEL5 is activated (e.g., reduced current operation mode). This causes only one of the transistors N1 and N2 to be turned on, so that the current supply capacity is restricted and the current consumption is reduced. The current supply capacities of the transistors N1 and N2 can be same as each other or can be different from each other. When the current supply capacities of the transistors N1 and N2 are different from each other as an example, the current supply capacity for the internal ground potential VSSi can be adjusted in three levels. The selection signals SEL4 and SEL5 can be inversion signals of the selection signals SEL1 and SEL2, respectively.

Figure 2D:
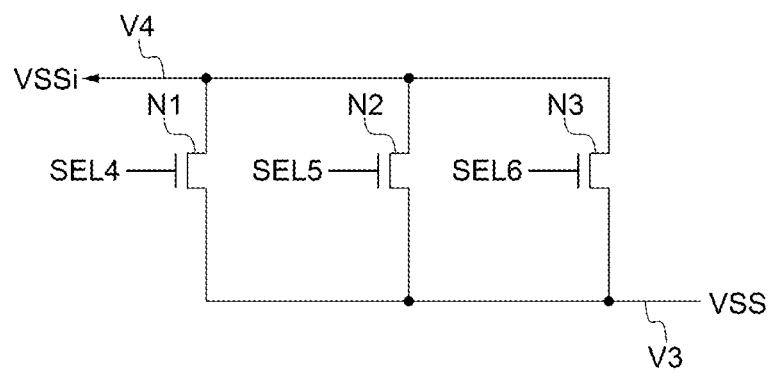
FIG. 2D is a circuit diagram showing another example of another main part of the power control circuit.

As shown in FIG. 2D, the power control circuit 30 may include three N-channel MOS transistors N1, N2, and N3 coupled in parallel. The external ground potential VSS is supplied in common to sources of the transistors N1, N2, and N3 via the power supply line V3. The transistors N1, N2, and N3 are turned on by selection signals SEL4, SEL5, and SEL6, respectively, and the internal ground potential VSSi is output from drains thereof via the power supply line V4. When a high performance is required, the selection signals SEL4, SEL5, and SEL6 are all activated (e.g., high current operation mode). This causes all the transistors N1, N2, and N3 to be turned on, so that a high current supply capacity can be obtained. On the other hand, when the current consumption is to be reduced, one or two of the selection signals SEL4, SEL5, and SEL6 is inactivated (e.g., multiple reduced current operation modes). This causes one or two of the transistors N1, N2, and N3 to be turned off, so that the current supply capacity is restricted and the current consumption is reduced. The current supply capacities of the transistors N1, N2, and N3 can be same as each other or can be different from each other. When the current supply capacities of the transistors N1, N2, and N3 are different from each other as an example, the current supply capacity for the internal ground potential VSSi can be adjusted in seven levels. The selection signals SEL4, SEL5, and SEL6 can be inversion signals of the selection signals SEL1, SEL2, and SEL3, respectively.

Figure 3A:
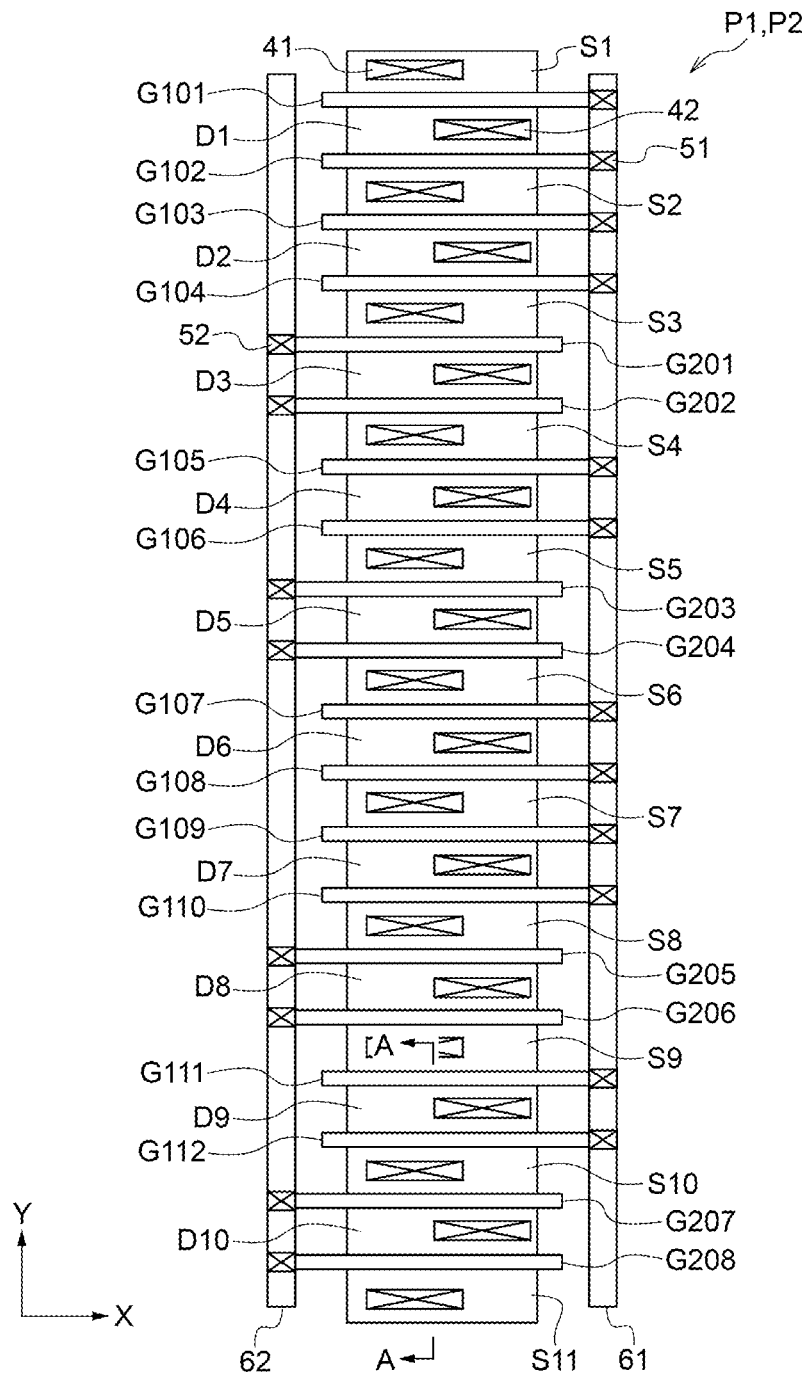
FIG. 3A is a schematic plan view showing a first example of a layout of power transistors included in the power control circuit.
Figure 3B:
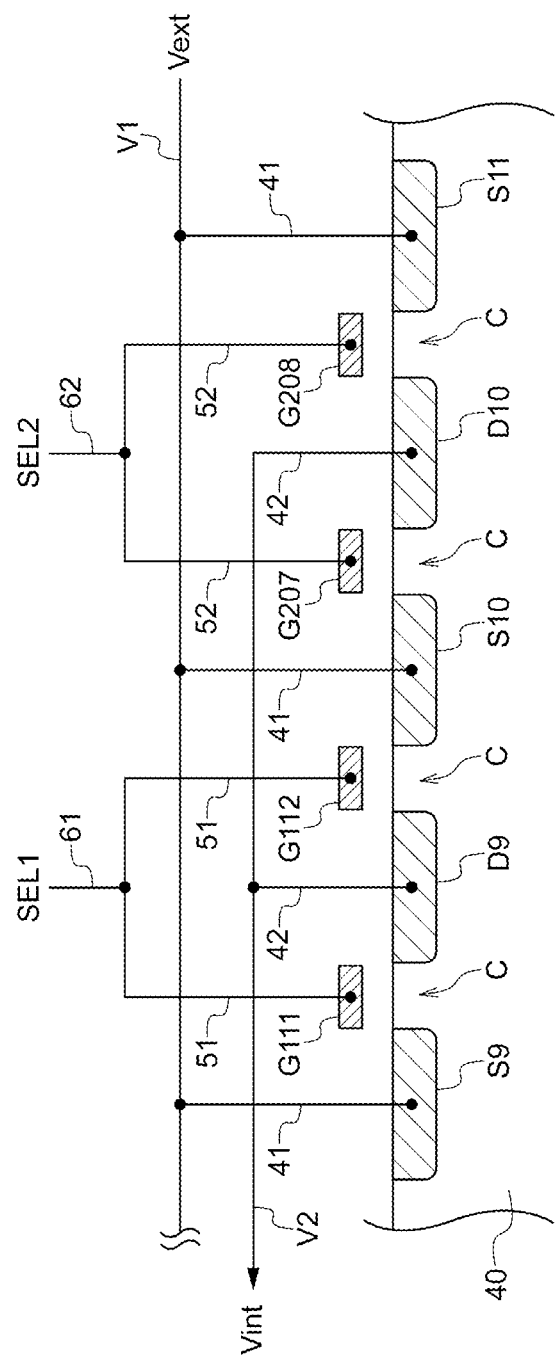
FIG. 3B is a schematic sectional view along a line A-A shown in FIG. 3A.

FIG. 3A is a schematic plan view showing a first example of the layout of the transistors P1 and P2 shown in FIG. 2A. FIG. 3B is a schematic sectional view along a line A-A shown in FIG. 3A. As shown in FIGS. 3A and 3B, the transistors P1 and P2 include source regions S1 to S11 and drain regions D1 to D10 alternately arranged in a Y direction with channel regions C interposed therebetween, respectively, and gate electrodes G101 to G112 and G201 to G208 arranged on (e.g., covering) the channel regions C, respectively. The source regions S1 to S11 and the drain regions D1 to D10 are impurity diffusion regions provided on a semiconductor substrate 40 and the conductivity types thereof are a P-type when the transistors P1 and P2 are P-channel MOS transistors. Meanwhile, the conductivity type of the channel regions C is an N-type.

Figure 4:
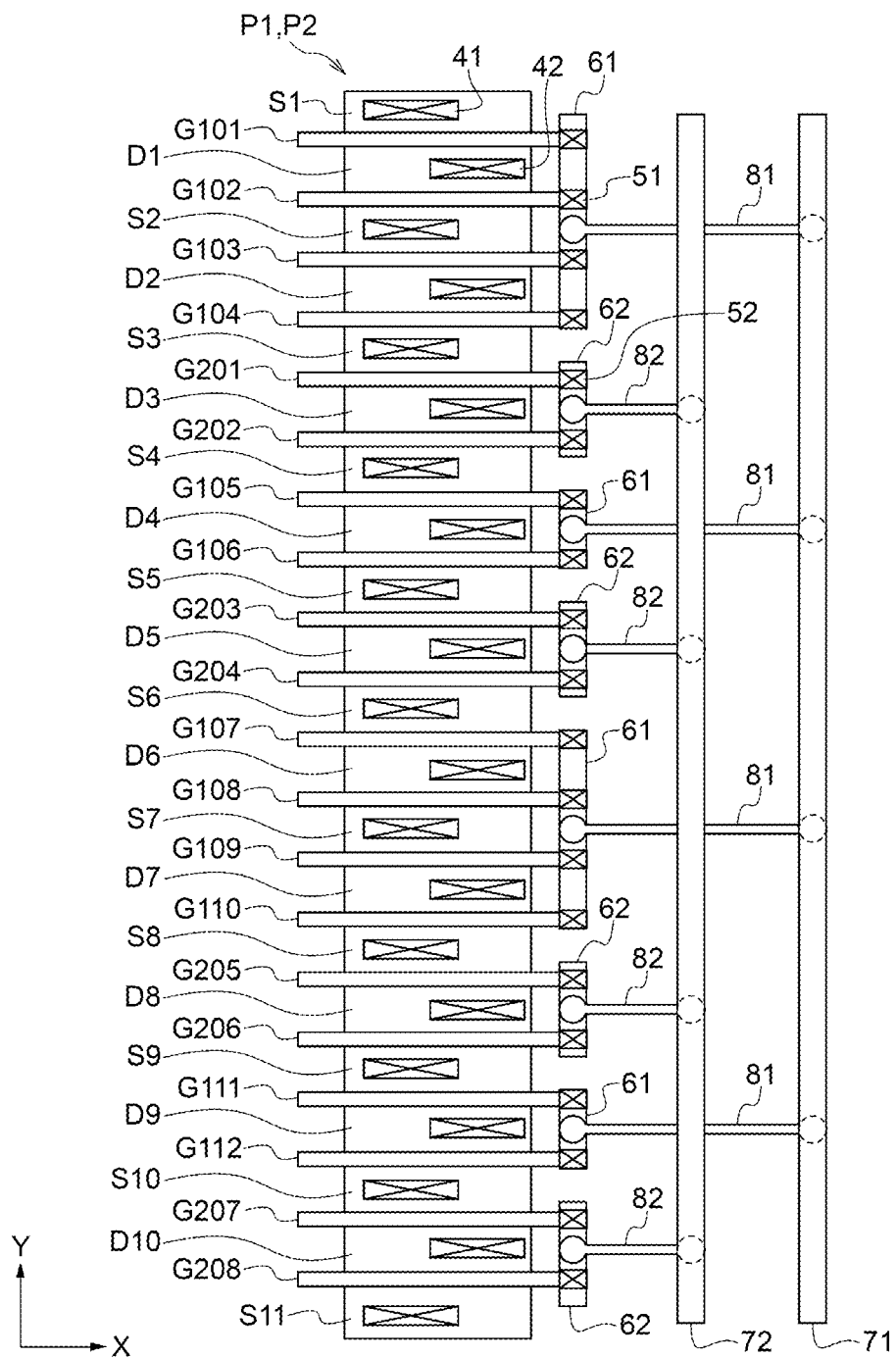
FIG. 4 is a schematic sectional view showing a modification of a signal line shown in FIG. 3A.

The source regions S1 to S11 are coupled in common to the power supply line V1 supplied with the external power potential VDD via contact conductors 41, respectively. The drain regions D1 to D10 are coupled in common to the power supply line V2 supplying the internal power potential VDDi via contact conductors 42, respectively. The gate electrodes G101 to G112 extend in an X direction and one ends thereof in the X direction are coupled in common to a signal line 61 via contact conductors 51, respectively. The gate electrodes G201 to G208 extend in the X direction and one ends thereof in the X direction are coupled in common to a signal line 62 via contact conductors 52, respectively. The signal lines 61 and 62 are lines supplied with the selection signals SEL1 and SEL2, respectively, and both extend in the Y direction. In the example shown in FIG. 3A, in a plan view, the transistors P1 and P2 are arranged between the signal line 61 and the signal line 62. Alternatively, as shown in FIG. 4, each of the signal lines 61 and 62 may be divided into a plurality of parts and the divided signal lines 61 and 62 may be arranged in a line in the Y direction on a side in the X direction as viewed from the transistors P1 and P2. In this case, signal lines 71 and 72 located in a wiring layer upper than the signal lines 61 and 62 and respectively supplying the selection signals SEL1 and SEL2 may be used. The signal lines 71 and 72 both extend in the Y direction. The signal lines 71 and 72 are coupled to the signal lines 61 and 62 via signal lines 81 and 82, respectively. The signal lines 81 and 82 are located in a wiring layer positioned between the signal lines 61 and 62 and the signal lines 71 and 72 and all extend in the X direction.

As shown in FIG. 3A, in a plan view, the gate electrode G101 is arranged between the source region S1 and the drain region D1, the gate electrode G102 is arranged between the drain region D1 and the source region S2, the gate electrode G103 is arranged between the source region S2 and the drain region D2, the gate electrode G104 is arranged between the drain region D2 and the source region S3, the gate electrode G105 is arranged between the source region S4 and the drain region D4, the gate electrode G106 is arranged between the drain region D4 and the source region S5, the gate electrode G107 is arranged between the source region S6 and the drain region D6, the gate electrode G108 is arranged between the drain region D6 and the source region S7, the gate electrode G109 is arranged between the source region S7 and the drain region D7, the gate electrode G110 is arranged between the drain region D7 and the source region S8, the gate electrode G111 is arranged between the source region S9 and the drain region D9, and the gate electrode G112 is arranged between the drain region D9 and the source region S10. In a plan view, the gate electrode G201 is arranged between the source region S3 and the drain region D3, the gate electrode G202 is arranged between the drain region D3 and the source region S4, the gate electrode G203 is arranged between the source region S5 and the drain region D5, the gate electrode G204 is arranged between the drain region D5 and the source region S6, the gate electrode G205 is arranged between the source region S8 and the drain region D8, the gate electrode G206 is arranged between the drain region D8 and the source region S9, the gate electrode G207 is arranged between the source region S10 and the drain region D10, and the gate electrode G208 is arranged between the drain region D10 and the source region S11. Accordingly, the transistor P1 is divided into a sub transistor having the gate electrodes G101 to G104, a sub transistor having the gate electrodes G105 and G106, a sub transistor having the gate electrodes G107 to G110, and a sub transistor having the gate electrodes G111 and G112. The transistor P2 is divided into a sub transistor having the gate electrodes G201 and G202, a sub transistor having the gate electrodes G203 and G204, a sub transistor having the gate electrodes G205 and G206, and a sub transistor having the gate electrodes G207 and G208.

According to this layout, current flows from the source regions S1 to S10 to the drain regions D1, D2, D4, D6, D7, and D9 when the selection signal SEL1 is in an active state (a low level) and the selection signal SEL2 is in an inactive state (a high level). At this time, since two gate electrodes G102 and G103 are allocated to the source region S2, the current flows from the source region S2 to two drain regions D1 and D2. Similarly, since two gate electrodes G108 and G109 are allocated to the source region S7, the current flows from the source region S7 to two drain regions D6 and D7. In contrast thereto, since an associated one of the gate electrodes G101, G104 to G107, and G110 to G112 is allocated to each of the other source regions S1, S3 to S6, and S8 to S10, the current flows from the source regions S1, S3 to S6, and S8 to S10 to any of the associated drain regions D1, D2, D4, D6, D7 and D9. Therefore, more current flows in the source regions S2 and S7 from which the current flows to two drain regions than in the source regions S1, S3 to S6, and S8 to S10 from which the current flows to one drain region. As a result, the current supply capacities of transistors sharing the source region S2 and transistors sharing the source region S7 are decreased. However, only the two source regions S2 and S7 are shared in the transistor P1 and the other source regions S1, S3 to S6, and S8 to S10 are not shared in the layout shown in FIG. 3A. Accordingly, the decrease in the current supply capacity resulting from sharing of the source regions can be avoided. Furthermore, since the amount of the current flowing in the source regions S1, S3 to S6, and S8 to S10 is reduced, voltage drop in the contact conductors 41 is also avoided.

On the other hand, when the selection signal SEL1 is in an inactive state (a high level) and the selection signal SEL2 is in an active state (a low level), the current flows from the source regions S3 to S6 and S8 to S11 to the drain regions D3, D5, D8, and D10. Since an associated one of the gate electrodes G201 to G208 is allocated to each of the source regions S3 to S6 and S8 to S11, the current flows from the source regions S3 to S6 and S8 to S11 to any of the associated drain regions D3, D5, D8 and D10. That is, since no source region is shared in the transistor P2, any decrease in the current supply capacity resulting from sharing of the source regions does not occur.

In the layout shown in FIG. 3A, the twelve transistors coupled in parallel are turned on when the selection signal SEL1 is activated and the eight transistors coupled in parallel are turned on when the selection signal SEL2 is activated. Accordingly, the current supply capacity for the internal power potential VDDi can be adjusted by activation of one or both of the selection signals SEL1 and SEL2. The same layout shown in FIG. 3A can also be adopted for the transistors N1 and N2 shown in FIG. 2C.

Figure 5:
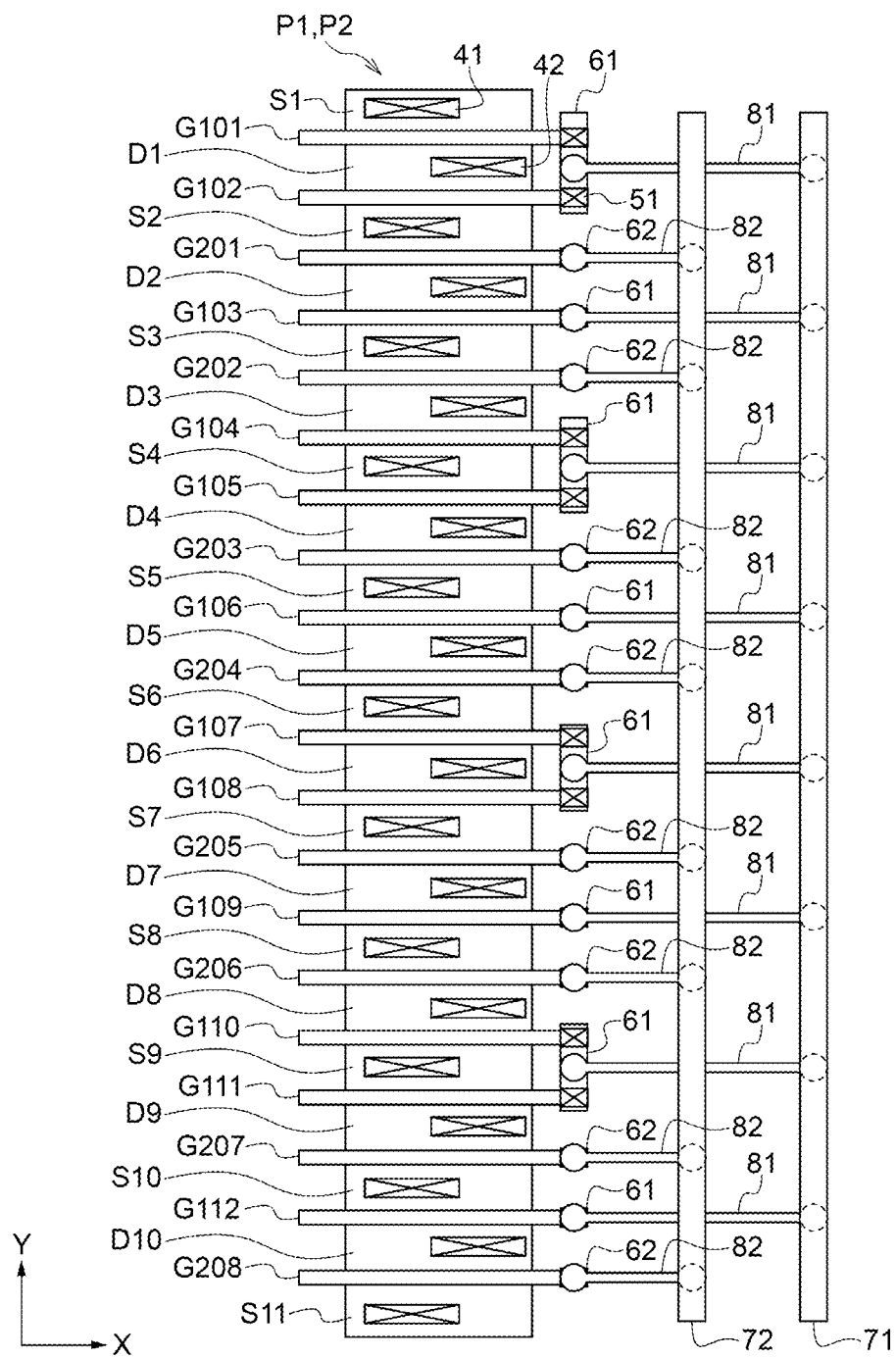
FIG. 5 is a schematic plan view showing a second example of a layout of the power transistors included in the power control circuit.

FIG. 5 is a schematic plan view showing a second example of the layout of the transistors P1 and P2 shown in FIG. 2A. In the second example shown in FIG. 5, the transistors P1 and P2 include the source regions S1 to S11 and the drain regions D1 to D10 alternately arranged in the Y direction with the channel regions C interposed therebetween, respectively, and the gate electrodes G101 to G112 and G201 to G208 arranged on (e.g., covering) the channel regions C, respectively, similarly to the first example shown in FIG. 3A. In the example shown in FIG. 5, the selection signal SEL1 is supplied in common to the gate electrodes G101 to G112 via the signal lines 71, 81, and 61 and the selection signal SEL2 is supplied in common to the gate electrodes G201 to G208 via the signal lines 72, 82, and 62 similarly to the example shown in FIG. 4.

As shown in FIG. 5, in a plan view, the gate electrode G101 is arranged between the source region S1 and the drain region D1, the gate electrode G102 is arranged between the drain region D1 and the source region S2, the gate electrode G103 is arranged between the drain region D2 and the source region S3, the gate electrode G104 is arranged between the drain region D3 and the source region S4, the gate electrode G105 is arranged between the source region S4 and the drain region D4, the gate electrode G106 is arranged between the source region S5 and the drain region D5, the gate electrode G107 is arranged between the source region S6 and the drain region D6, the gate electrode G108 is arranged between the drain region D6 and the source region S7, the gate electrode G109 is arranged between the drain region D7 and the source region S8, the gate electrode G110 is arranged between the drain region D8 and the source region S9, the gate electrode G111 is arranged between the source region S9 and the drain region D9, and the gate electrode G112 is arranged between the source region S10 and the drain region D10. In a plan view, the gate electrode G201 is arranged between the source region S2 and the drain region D2, the gate electrode G202 is arranged between the source region S3 and the drain region D3, the gate electrode G203 is arranged between the drain region D4 and the source region S5, the gate electrode G204 is arranged between the drain region D5 and the source region S6, the gate electrode G205 is arranged between the source region S7 and the drain region D7, the gate electrode G206 is arranged between the source region S8 and the drain region D8, the gate electrode G207 is arranged between the drain region D9 and the source region S10, and the gate electrode G208 is arranged between the drain region D10 and the source region S11. Accordingly, the transistor P1 is divided into a sub transistor having the gate electrodes G101 and G102, a sub transistor having the gate electrode G103, a sub transistor having the gate electrodes G104 and G105, a sub transistor having the gate electrode G106, a sub transistor having the gate electrodes G107 and G108, a sub transistor having the gate electrode G109, a sub transistor having the gate electrodes G110 and G111, and a sub transistor having the gate electrode G112. The transistor P2 is divided into a plurality of sub transistors having the gate electrodes G201 to G208, respectively.

According to this layout, the current flows from the source regions S1 to S10 to the drain regions D1 to D10 when the selection signal SEL1 is in an active state (a low level) and the selection signal SEL2 is in an inactive state (a high level). At this time, since two gate electrodes G104 and G105 are allocated to the source region S4, the current flows from the source region S4 to two drain regions D3 and D4. Similarly, since two gate electrodes G110 and G111 are allocated to the source region S9, the current flows from the source region S9 to two drain regions D8 and D9. In contrast thereto, an associated one of the gate electrodes G101 to G103, G106 to G109, and G112 is allocated to each of the other source regions S1 to S3, S5 to S8, and S10. Therefore, the current flows from the source regions S1 to S3, S5 to S8, and S10 to any of the associated drain regions D1, D2, D5 to D7, and D10. Accordingly, more current flows in the source regions S4 and S9 from which the current flows to two drain regions than in the source regions S1 to S3, S5 to S8, and S10 from which the current flows to one drain region. As a result, the current supply capacities of transistors sharing the source region S4 and transistors sharing the source region S9 are decreased. However, since only the two source regions S4 and S9 are shared in the transistors P1 and the other source regions S1 to S3, S5 to S8, and S10 are not shared in the layout shown in FIG. 5, the decrease in the current supply capacity resulting from sharing of the source regions can be avoided. Furthermore, since the amount of the current flowing in the source regions S1 to S3, S5 to S8, and S10 is reduced, voltage drop in the contact conductors 41 is also avoided.

Further, since two gate electrodes G101 and G102 are allocated to the drain region D1, the current from the two source regions S1 and S2 flows to the drain region D1. Similarly, since two gate electrodes G107 and G108 are allocated to the drain region D6, the current from the two source regions S6 and S7 flows to the drain region D6. However, only the two drain regions D1 and D6 are shared in the transistor P1 and the other drain regions D2 to D5 and D7 to D10 are not shared in the layout shown in FIG. 5 and therefore the decrease in the current supply capacity resulting from sharing of the drain regions is also avoided. Furthermore, since the amount of the current flowing in the drain regions D2 to D5 and D7 to D10 is reduced, voltage drop in the contact conductors 42 is also avoided.

On the other hand, when the selection signal SEL1 is in an inactive state (a high level) and the selection signal SEL2 is in an active state (a low level), the current flows from the source regions S2, S3, S5 to S8, S10, and S11 to the drain regions D2 to D5, and D7 to D10. An associated one of the gate electrodes G201 to G208 is allocated to each of the source regions S2, S3, S5 to S8, S10, and S11 and the current flows from the source regions S2, S3, S5 to S8, S10, and S11 to the associated drain regions D2 to D5 and D7 to D10. That is, since no source regions or drain regions are shared in the transistor P2, any decrease in the current supply capacity resulting from sharing of the source regions or sharing of the drain regions does not occur.

Also in the layout shown in FIG. 5, the twelve transistors coupled in parallel are turned on when the selection signal SEL1 is activated and the eight transistors coupled in parallel are turned on when the selection signal SEL2 is activated. Accordingly, the current supply capacity for the internal power potential VDDi can be adjusted by activation of one or both of the selection signals SEL1 and SEL2.

Figure 6:
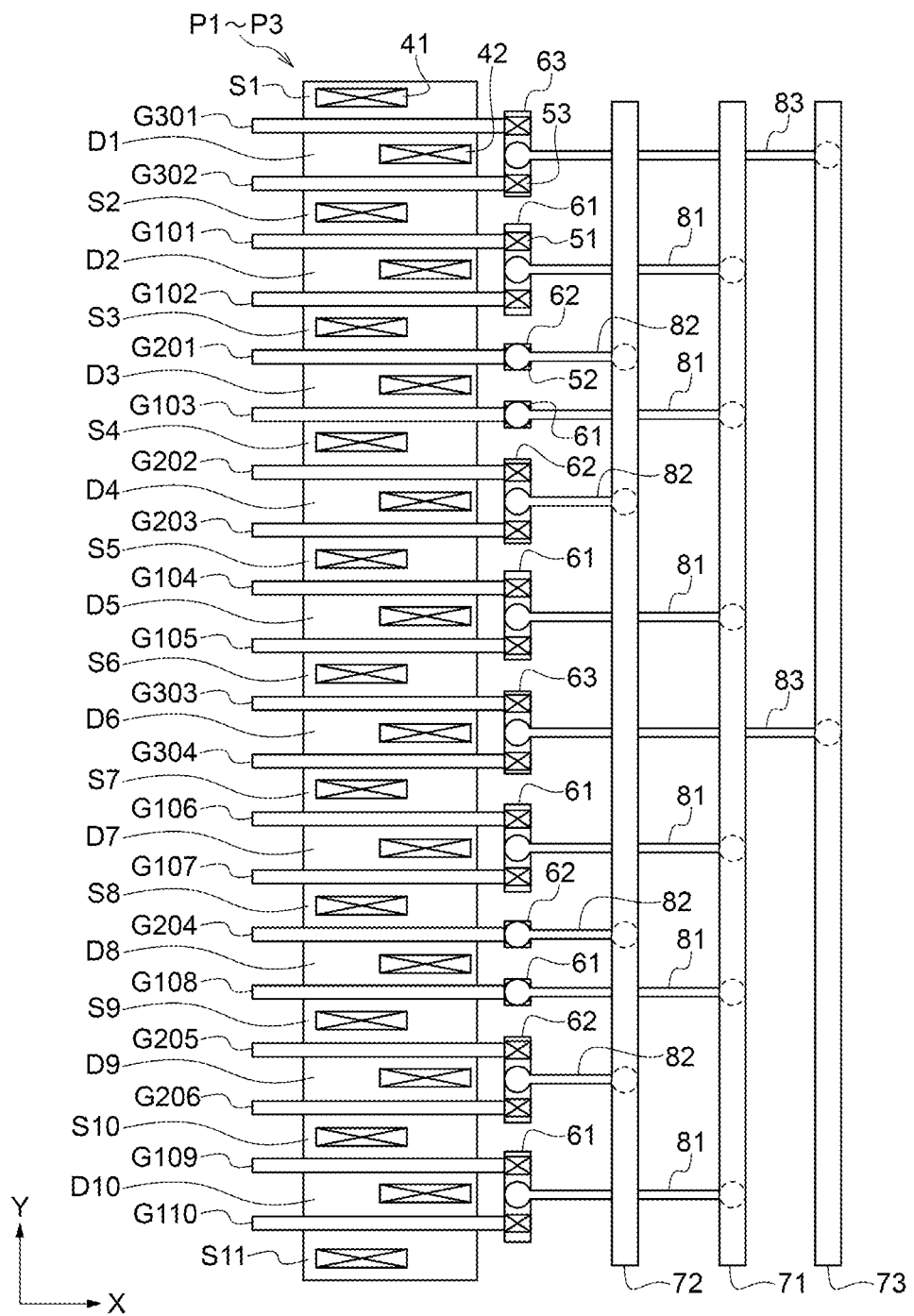
FIG. 6 is a schematic plan view showing a third example of a layout of the power transistors included in the power control circuit.

FIG. 6 is a schematic plan view showing an example of the layout of the transistors P1 to P3 shown in FIG. 2B. As shown in FIG. 6, the transistors P1 to P3 include the source regions S1 to S11 and the drain regions D1 to D10 alternately arranged in the Y direction with channel regions C interposed therebetween, respectively, and gate electrodes G101 to G110, G201 to G206, and G301 to G304 arranged on (e.g., covering) the channel regions C, respectively. The source regions S1 to S11 are coupled in common to the power supply line V1 supplied with the external power potential VDD via the contact conductors 41, respectively. The drain regions D1 to D10 are coupled in common to the power supply line V2 supplying the internal power potential VDDi via the contact conductors 42, respectively. The gate electrodes G101 to G110 extend in the X direction and one ends thereof in the X direction are coupled in common to the signal line 61 via the contact conductors 51, respectively. The gate electrodes G201 to G206 extend in the X direction and one ends thereof in the X direction are coupled in common to the signal line 62 via the contact conductors 52, respectively. The gate electrodes G301 to G304 extend in the X direction and one ends thereof in the X direction are coupled in common to a signal line 63 via contact conductors 53, respectively. In the example shown in FIG. 6, the selection signal SEL1 is supplied in common to the gate electrodes G101 to G110 via the signal lines 71, 81, and 61, the selection signal SEL2 is coupled in common to the gate electrodes G201 to G206 via the signal lines 72, 82, and 62, and the selection signal SEL3 is coupled in common to the gate electrodes G301 to G304 via signal lines 73, 83, and 63.

As shown in FIG. 6, in a plan view, the gate electrode G101 is arranged between the source region S2 and the drain region D2, the gate electrode G102 is arranged between the drain region D2 and the source region S3, the gate electrode G103 is arranged between the drain region D3 and the source region S4, the gate electrode G104 is arranged between the source region S5 and the drain region D5, the gate electrode G105 is arranged between the drain region D5 and the source region S6, the gate electrode G106 is arranged between the source region S7 and the drain region D7, the gate electrode G107 is arranged between the drain region D7 and the source region S8, the gate electrode G108 is arranged between the drain region D8 and the source region S9, the gate electrode G109 is arranged between the source region S10 and the drain region D10, and the gate electrode G110 is arranged between the drain region D10 and the source region S11. In a plan view, the gate electrode G201 is arranged between the source region S3 and the drain region D3, the gate electrode G202 is arranged between the source region S4 and the drain region D4, the gate electrode G203 is arranged between the drain region D4 and the source region S5, the gate electrode G204 is arranged between the source region S8 and the drain region D8, the gate electrode G205 is arranged between the source region S9 and the drain region D9, and the gate electrode G206 is arranged between the drain region D9 and the source region S10. Furthermore, in a plan view, the gate electrode G301 is arranged between the source region S1 and the drain region D1, the gate electrode G302 is arranged between the drain region D1 and the source region S2, the gate electrode G303 is arranged between the source region S6 and the drain region D6, and the gate electrode G304 is arranged between the drain region D6 and the source region S7. Accordingly, the transistor P1 is divided into a sub transistor having the gate electrodes G101 and G102, a sub transistor having the gate electrode G103, a sub transistor having the gate electrodes G104 and G105, a sub transistor having the gate electrodes G106 and G107, a sub transistor having the gate electrode G108, and a sub transistor having the gate electrodes G109 and G110. The transistor P2 is divided into a sub transistor having the gate electrode G201, a sub transistor having the gate electrodes G202 and G203, a sub transistor having the gate electrode G204, and a sub transistor having the gate electrodes G205 and G206. The transistor P3 is divided into a sub transistor having the gate electrodes G301 and G302, and a sub transistor having the gate electrodes G303 and G304.

According to this layout, current flows from the source regions S2 to S11 to the drain regions D2, D3, D5, D7, D8, and D10 when the selection signal SEL1 is in an active state (a low level) and the selection signals SEL2 and SEL3 are in an inactive state (a high level). The gate electrodes G101 to G110 are allocated to the source regions S2 to S11, respectively, and the current flows from the source regions S2 to S11 to any of the associated drain regions D2, D3, D5, D7, D8, and D10. That is, since the source regions are not shared in the transistor P1, any decrease in the current supply capacity resulting from sharing of the source regions does not occur.

When the selection signal SEL2 is in an active state (a low level) and the selection signals SEL1 and SEL3 are in an inactivate state (a high level), the current flows from the source regions S3 to S5 and S8 to S10 to the drain regions D3, D4, D8, and D9. An associated one of the gate electrodes G201 to G206 is allocated to each of the source regions S3 to S5 and S8 to S10 and the current flows from the source regions S3 to S5 and S8 to S10 to any of the associated drain regions D3, D4, D8, and D9. That is, since the source regions are not shared also in the transistor P2, any decrease in the current supply capacity resulting from sharing of the source regions does not occur.

When the selection signal SEL3 is in an inactive state (a high level) and the selection signals SEL1 and SEL2 are in an active state (a low level), the current flows from the source regions S1, S2, S6, and S7 to the drain regions D1 and D6. An associated one of the gate electrodes G301 to G304 is allocated to each of the source regions S1, S2, S6, and S7 and the current flows from the source regions S1, S2, S6, and S7 to any of the associated drain regions D1 and D6. That is, since the source regions are not shared also in the transistor P3, any decrease in the current supply capacity resulting from sharing of the source regions does not occur.

In a layout shown in FIG. 6, the ten transistors coupled in parallel are turned on when the selection signal SEL1 is activated, the six transistors coupled in parallel are turned on when the selection signal SEL2 is activated, and the four transistors coupled in parallel are turned on when the selection signal SEL3 is activated. Accordingly, the current supply capacity for the internal power potential VDDi can be adjusted by activation of one or two or more of the selection signals SEL1 to SEL3. The same layout as that shown in FIG. 6 can be adopted also for the transistors N1, N2, and N3 shown in FIG. 2D.

Although various embodiments have been disclosed in the context of certain preferred embodiments and examples, it will be understood by those skilled in the art that the scope of the present disclosure extends beyond the specifically disclosed embodiments to other alternative embodiments and/or uses of the embodiments and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying modes of the disclosed embodiments. Thus, it is intended that the scope of at least some of the present disclosure should not be limited by the particular disclosed embodiments described above.

The invention claimed is:

1. An apparatus comprising:
a semiconductor substrate including a plurality of first and second diffusion regions having a first conductivity type and a plurality of channel regions having a second conductivity type different from the first conductivity type, the plurality of first diffusion regions and the plurality of second diffusion regions being alternately arranged in a first direction with the plurality of channel regions interposed therebetween; and
a plurality of gate electrodes extending in a second direction different from the first direction, each of the plurality of gate electrodes covering an associated one of the plurality of channel regions,
wherein the plurality of first diffusion regions are coupled in common to a first power supply line,
wherein the plurality of second diffusion regions are coupled in common to a second power supply line,
wherein the plurality of gate electrodes are grouped into first, second, and third gate groups,
wherein the second gate group are arranged between the first and third gate groups in the first direction,
wherein a plurality of gate electrodes included in the first and third gate groups are supplied with a first control signal in common, and
wherein a plurality of gate electrodes included in the second gate group are supplied with a second control signal different from the first control signal in common.

2. The apparatus of claim 1, wherein one of the first and second control signals is brought into an active state and other of the first and second control signals is brought into an inactive state in a first operation mode.

3. The apparatus of claim 2, wherein the first and second control signals are brought into an active state in a second operation mode.

4. The apparatus of claim 1,
wherein one of the plurality of first diffusion regions is arranged between the first and second gate groups in a plan view, and
wherein another one of the plurality of first diffusion regions is arranged between the second and third gate groups in a plan view.

5. The apparatus of claim 4,
wherein the plurality of first diffusion regions function as a source region, and
wherein the plurality of second diffusion regions function as a drain region.

6. The apparatus of claim 5, wherein the second gate group consists of two gate electrodes.

7. The apparatus of claim 1,
wherein the plurality of gate electrodes include a fourth gate group,
wherein the third gate group is arranged between the second and fourth gate groups in the first direction, and
wherein a plurality of gate electrodes included in the second and fourth gate groups are supplied with the second control signal in common.

8. The apparatus of claim 7, wherein a number of gate electrodes included in the first and third gate groups is different from a number of gate electrodes included in the second and fourth gate groups.

9. The apparatus of claim 7,
wherein the plurality of gate electrodes further include a fifth gate group,
wherein the fourth gate group is arranged between the third and fifth gate groups in the first direction, and
wherein a plurality of gate electrodes included in the first, third, and fifth gate groups are supplied with the first control signal in common.

10. The apparatus of claim 7,
wherein the plurality of gate electrodes further include a fifth gate group,
wherein the fourth gate group is arranged between the third and fifth gate groups in the first direction, and
wherein one or ones of gate electrodes included in the fifth gate groups is supplied with a third control signal different from the first and second control signals in common.

11. The apparatus of claim 10, wherein at least one of the first, second, and third control signals is brought into an active state and a remaining one or ones thereof is brought into an inactive state in a third operation mode.

12. An apparatus comprising:
a semiconductor substrate including a plurality of source regions and a plurality of drain regions alternately arranged; and
a plurality of gate electrodes each arranged between an associated one of the plurality of source regions and an associated one of the drain regions in a plan view, wherein the plurality of source regions are coupled in common to a first power supply line, wherein the plurality of drain regions are coupled in common to a second power supply line, wherein the plurality of drain regions include first, second, and third drain regions, wherein the plurality of source regions include a first source region arranged between the first and second drain regions, and a second source region arranged between the first and third drain regions, wherein the plurality of gate electrodes include a first gate electrode arranged between the first source region and the first drain region in a plan view, a second gate electrode arranged between the second source region and the first drain region in a plan view, a third gate electrode arranged between the first source region and the second drain region in a plan view, and a fourth gate electrode arranged between the second source region and the third drain region in a plan view, wherein the first and second gate electrodes are supplied with a first control signal in common, and wherein the third and fourth gate electrodes are supplied with a second control signal different from the first control signal in common.

13. The apparatus of claim 12, wherein the plurality of source regions further include a third source region, wherein the second drain region is arranged between the first and third source regions, wherein the plurality of gate electrodes further include a fifth gate electrode arranged between the third source region and the second drain region in a plan view, and wherein the fifth gate electrode is supplied with the second control signal.

14. The apparatus of claim 13, wherein the plurality of source regions further include a fourth source region, wherein the third drain region is arranged between the second and fourth source regions, wherein the plurality of gate electrodes further include a sixth gate electrode arranged between the fourth source region and the third drain region in a plan view, and wherein the sixth gate electrode is supplied with the second control signal.

15. The apparatus of claim 14, wherein the plurality of source regions further include a fifth source region, wherein the plurality of drain regions further include a fourth source region arranged between the fourth and fifth source regions, wherein the plurality of gate electrodes further include a seventh gate electrode arranged between the fourth source region and the fourth drain region in a plan view, and an eighth gate electrode arranged between the fifth source region and the fourth drain region in a plan view, and wherein the seventh and eighth gate electrodes are supplied with the first control signal in common.

16. The apparatus of claim 12, wherein the plurality of source regions further include third and fourth source regions, wherein the second drain region is arranged between the first and third source regions, wherein the third drain region is arranged between the second and fourth source regions, wherein the plurality of gate electrodes further include a fifth gate electrode arranged between the third source region and the second drain region in a plan view, and a sixth gate electrode arranged between the fourth source region and the third drain region in a plan view, and wherein the fifth and sixth gate electrode are supplied with the first control signal in common.

17. An apparatus comprising:

a peripheral circuit;

a first voltage line supplied with a first voltage;

a second voltage line coupled to supply a second voltage derived from the first voltage to the peripheral circuit; and a first transistor and a second transistor coupled in parallel between the first voltage line and the second voltage line and configured to receive first and second control signals, respectively;

wherein the first transistor and the second transistor comprise a plurality of first sub transistors and a plurality of second sub transistors, respectively and each of the plurality of first sub transistors is arranged adjacently to an associated one of the plurality of second sub transistors.

18. The apparatus of claim 17, wherein the first voltage is supplied externally.

19. An apparatus comprising:

a peripheral circuit;

a first voltage line supplied with a first voltage;

a second voltage line coupled to supply a second voltage derived from the first voltage to the peripheral circuit; and a first transistor, a second transistor and a third transistor coupled in parallel between the first voltage line and the second voltage line and configured to receive first, second and third control signals, respectively;

wherein the first transistor, the second transistor and the third transistor comprise a plurality of first sub transistors, a plurality of second sub transistors and a plurality of third sub transistors, respectively and each of the plurality of first sub transistors is arranged adjacently to an associated one of the plurality of second sub transistors or an associated one of the plurality of third sub transistors.

20. The apparatus of claim 19, wherein the first voltage is supplied externally.

* * * * *